US009312068B2

(12) United States Patent
Sim et al.

(10) Patent No.: US 9,312,068 B2
(45) Date of Patent: Apr. 12, 2016

(54) COIL COMPONENT AND METHOD OF MANUFACTURING THE SAME

(71) Applicant: SAMSUNG ELECTRO-MECHANICS CO., LTD., Suwon-Si, Gyeonggi-Do (KR)

(72) Inventors: Won Chul Sim, Suwon-Si (KR); Ju Hwan Yang, Suwon-Si (KR)

(73) Assignee: Samsung Electro-Mechanics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/492,973

(22) Filed: Sep. 22, 2014

(65) Prior Publication Data

US 2015/0145627 A1 May 28, 2015

(30) Foreign Application Priority Data

Nov. 28, 2013 (KR) ........................ 10-2013-0146494

(51) Int. Cl.

| | |
|---|---|
| ***H01L 27/12*** | (2006.01) |
| ***H01L 27/146*** | (2006.01) |
| ***H01L 29/66*** | (2006.01) |
| ***H01F 41/04*** | (2006.01) |
| ***H01F 17/00*** | (2006.01) |
| *H01F 27/28* | (2006.01) |

(52) U.S. Cl.

CPC .......... *H01F 41/046* (2013.01); *H01F 17/0013* (2013.01); *H01F 27/2885* (2013.01); *H01F 2017/008* (2013.01); *H01F 2017/0093* (2013.01)

(58) Field of Classification Search

CPC ......... H01F 27/24; H01F 27/29; H01F 27/34; H01F 41/04

USPC ............ 257/258, 272, 355, 328, E21.41, 173, 257/E29.181, 31; 361/56, 11, 811; 438/270, 438/589, 29, 184, 3

See application file for complete search history.

(56) References Cited

U.S. PATENT DOCUMENTS

2004/0233606 A1* 11/2004 Inoue et al. .................. 361/118
2007/0040163 A1* 2/2007 Okuzawa et al. ............... 257/31
2009/0251268 A1* 10/2009 Sato ............................ 336/200
2010/0157501 A1* 6/2010 Asakura et al. ............... 361/112
2010/0157565 A1* 6/2010 Yoshida et al. ............... 361/811
2011/0007438 A1* 1/2011 Ito et al. ......................... 361/56
2011/0291790 A1* 12/2011 Okumura et al. ............. 336/200

FOREIGN PATENT DOCUMENTS

KR 10-2010-0037000 A 4/2010

* cited by examiner

*Primary Examiner* — Long K Tran
*Assistant Examiner* — Dzung Tran
(74) *Attorney, Agent, or Firm* — McDermott Will & Emery LLP

(57) ABSTRACT

Disclosed herein is a coil component capable of being protected from static electricity without loss of a main magnetic flux loop. The coil component includes: a magnetic substrate; a coil layer disposed on the magnetic substrate and having conductor patterns installed therein; and an electrostatic discharge (ESD) protecting layer disposed on the coil layer and discharging static electricity introduced into the conductor patterns.

9 Claims, 3 Drawing Sheets

COIL COMPONENT AND METHOD OF MANUFACTURING THE SAME

CROSS REFERENCE(S) TO RELATED APPLICATIONS

This application claims the foreign priority benefit under 35 U.S.C. Section 119 of Korean Patent Application Serial No. 10-2013-0146494, entitled "Coil Component and Method of Manufacturing the Same" filed on Nov. 28, 2013, which is hereby incorporated by reference in its entirety into this application.

BACKGROUND OF THE INVENTION

1. Technical Field

The present invention relates to a coil component, and more particularly, to a coil component having an electrostatic discharge (ESD) protecting function.

2. Description of the Related Art

In accordance with the development of a technology, electronic devices such as a portable phone, a home appliance, a personal computer (PC), a personal digital assistant (PDA), a liquid crystal display (LCD), and the like, have been changed from an analog scheme into a digital scheme and a speed of the electronic devices has increased due to an increase in an amount of processed data. Therefore, a universal serial bus (USB) 2.0, a USB 3.0, and a high-definition multimedia interface (HDMI) have been widely spread as high speed signal transmitting interfaces and have been used in many digital devices such as a personal computer and a digital high-definition television.

These high speed interfaces adopt a differential signal system transmitting differential signals (differential mode signals) using a pair of signal lines unlike a single-end transmitting system that has been generally used for a long period of time. However, the electronic devices that are digitized and have an increased speed are sensitive to a stimulus from the outside, such that distortion of signals due to high frequency noise has been often generated.

In order to remove this noise, a filter has been installed in the electronic device. Particularly, a common mode filter for removing common mode noise has been widely used in a high speed differential signal line, or the like. The common mode noise indicates noise generated in the differential signal line, and the common mode filter removes the common mode noise that may not be removed by an existing filter.

Meanwhile, since a recent high speed digital interface treats fine signals of which a transmission speed is high, an integrated circuit (IC) very sensitive to electrostatic discharge (hereinafter, referred to as "ESD") generated at the time of connection and disconnection between different devices) should be used. Therefore, Patent Document (Korean Patent Laid-Open Publication No. 10-2010-0037000) discloses a common mode filter including an ESD protecting layer protecting an internal circuit from static electricity.

That is, referring to FIG. 3 of Patent Document, the common mode filter further includes an ESD protecting layer 12b disposed beneath a common mode filter layer 12a functioning as a filter, wherein the ESD protecting layer includes an ESD absorbing layer 30 functioning as an ESD protecting material. Therefore, an overvoltage signal due to the static electricity passes through gap electrodes 28 and 29 maintaining a predetermined gap from a lead conductor. As a result, spiral conductors 17 an 18 of the common mode filter layer are protected.

However, the common mode filter disclosed in Patent Document has a structure in which the ESD protecting layer 12b is stacked on a magnetic substrate 11a in order to simultaneously fire the magnetic substrate 11a made of high temperature sintering ferrite and the ESD absorbing layer 30 made of a high temperature sintering insulating inorganic material. Therefore, the ESD protecting layer 12b is disposed between the common mode filter layer 12a and the magnetic substrate 11a.

The ESD absorbing layer 30 of the ESD protecting layer 12b contains an insulating inorganic material that is non-magnetic and has a lower magnetic permeability and a high magnetic resistance. Due to the above-mentioned structure, a main magnetic flux loop generated in the common mode filter layer 12a and formed using the magnetic substrate 11a as a closed magnetic circuit is blocked and lost by the ESD protecting layer 12b between the common mode filter layer 12a and the magnetic substrate 11a.

RELATED ART DOCUMENT

Patent Document (Patent Document 1) Korean Patent Laid-Open Publication No. 10-2010-0037000

SUMMARY OF THE INVENTION

An object of the present invention is to provide a coil component capable of implement a target impedance by minimizing loss of a main magnetic flux loop, and a method of manufacturing the same.

According to an exemplary embodiment of the present invention, there is provided a coil component including: a magnetic substrate; a coil layer disposed on the magnetic substrate and having conductor patterns installed therein; and an electrostatic discharge (ESD) protecting layer disposed on the coil layer and discharging static electricity introduced into the conductor patterns.

The ESD protecting layer may include external electrodes connected to the conductor patterns through via electrodes, ground electrodes spaced apart from the external electrodes, and ESD protecting materials formed between the external electrodes and the ground electrodes.

The ESD protecting material may be made of a low temperature curable resin in which metal powders are dispersed.

The ESD protecting layer may further include first bump electrodes disposed on the external electrodes, second bump electrodes disposed on the ground electrodes, and a magnetic resin material filled in the vicinity of the external electrodes and the ground electrodes as well as the first and second bump electrodes.

The magnetic resin material may be made of a mixture of a magnetic powder and a low temperature curable resin.

An internal space except for the conductor patterns in the coil layer may be made of an insulating material.

The coil component may further include a magnetic resin layer disposed between the coil layer and the ESD protecting layer.

The magnetic resin layer may be made of a mixture of a magnetic powder and a low temperature curable resin The conductor patterns may include primary conductor patterns and secondary conductor patterns electromagnetically coupled to each other.

According to another exemplary embodiment of the present invention, there is provided a method of manufacturing a coil component, including: preparing a magnetic substrate; forming a coil layer on the magnetic substrate, the coil layer having conductor patterns installed therein; and forming an ESD protecting layer on the coil layer.

The forming of the coil layer may be performed by a thin film process.

The forming of the ESD protecting layer may include plating external electrodes and ground electrodes, forming ESD protecting materials between the external electrodes and the ground electrodes, and sintering the ESD protecting materials at a low temperature.

The forming of the ESD protecting layer may further include, after the sintering of the ESD protecting materials at the low temperature, plating first bump electrodes on the external electrodes, plating second bump electrodes on the ground electrodes, and filling a magnetic paste in the vicinity of the external electrodes and the ground electrodes as well as the first and second bump electrodes.

The method may further include, before the forming of the ESD protecting layer, applying a magnetic paste onto the coil layer and then sintering the magnetic paste at a low temperature.

DESCRIPTION OF THE PREFERRED EMBODIMENTS

Various advantages and features of the present invention and methods accomplishing thereof will become apparent from the following description of exemplary embodiments with reference to the accompanying drawings. However, the present invention may be modified in many different forms and it should not be limited to exemplary embodiments set forth herein. These exemplary embodiments may be provided so that this disclosure will be thorough and complete, and will fully convey the scope of the invention to those skilled in the art.

Terms used in the present specification are for explaining exemplary embodiments rather than limiting the present invention. Unless explicitly described to the contrary, a singular form includes a plural form in the present specification. In addition, components, steps, operations, and/or elements mentioned in the present specification do not exclude the existence or addition of one or more other components, steps, operations, and/or elements.

Hereinafter, a configuration and an acting effect of exemplary embodiments of the preset invention will be described in more detail with reference to the accompanying drawings.

Figure 1:
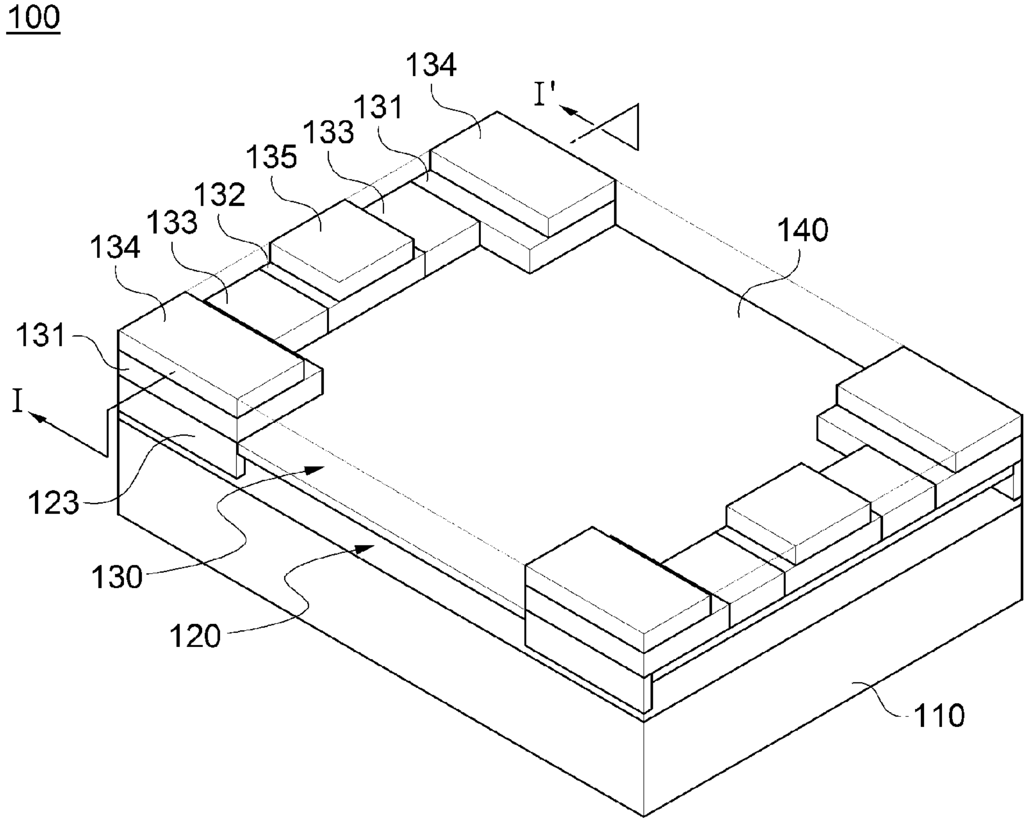
FIG. 1 is a perspective view for describing an internal structure of a coil component according to an exemplary embodiment of the present invention.
Figure 2:
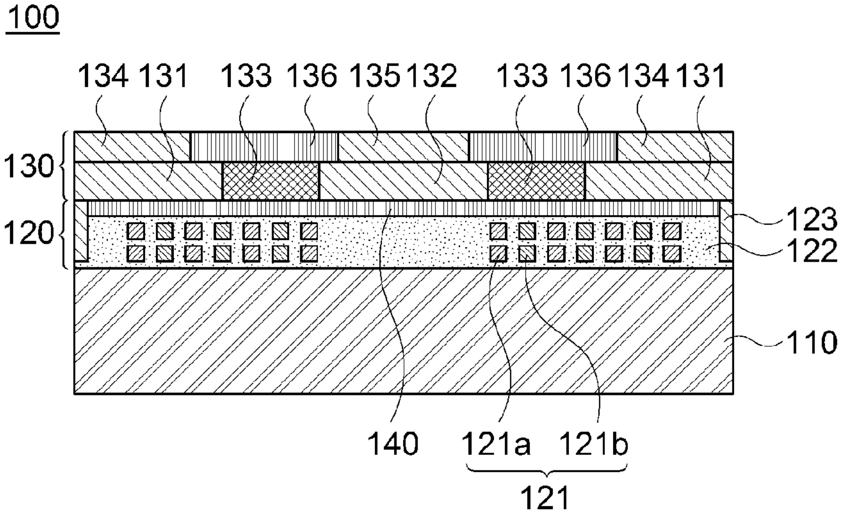
FIG. 2 is a cross-sectional view taken along line I-I' of FIG. 1.

FIG. 1 is a perspective view for describing an internal structure of a coil component according to an exemplary embodiment of the present invention; and FIG. 2 is a cross-sectional view taken along line I-I' of FIG. 1. Additionally, components shown in the accompanying drawings are not necessarily shown to scale. For example, sizes of some components shown in the accompanying drawings may be exaggerated as compared with other components in order to assist in the understanding of the exemplary embodiments of the present invention. Meanwhile, throughout the accompanying drawings, the same reference numerals will be used to describe the same components. For simplification and clearness of illustration, a general configuration scheme will be shown in the accompanying drawings, and a detailed description of the feature and the technology well known in the art will be omitted in order to prevent a discussion of exemplary embodiments of the present invention from being unnecessarily obscure.

Referring to FIGS. 1 and 2, a coil component 100 according to an exemplary embodiment of the present invention may be configured to include a magnetic substrate 110, a coil layer 120 disposed on the magnetic substrate 110, and an electrostatic discharge (ESD) protecting layer 130 disposed on the coil layer 120.

The magnetic substrate 110, which is a hexahedron having sizes corresponding to horizontal and vertical sizes of the coil component and made of ferrite, is disposed at the bottom in a process of manufacturing the coil component to become a support base of the coil layer 120 and the ESD protecting layer 130.

The magnetic substrate 110 functions as a closed magnetic circuit of the coil component simultaneously with functioning as a support body. Therefore, the magnetic substrate 110 may be formed by sintering any appropriate ferrite material as long as a predetermined inductance may be obtained. As an optimal ferrite material configuring the magnetic substrate 110, for example, an Ni based ferrite material containing $Fe_2O_3$ and NiO as main components, an Ni—Zn based ferrite material containing $Fe_2O_3$, NiO, and ZnO as main components, an Ni—Zn—Cu based ferrite material containing $Fe_2O_3$, NiO, ZnO, and CuO as main components, or the like, may be used. The ferrite material may be sintered under a high temperature atmosphere in order to enhance mechanical strength of the magnetic substrate 110 as the support body.

The coil layer 120 may include conductor patterns 121 disposed therein, wherein the conductor patterns 121, which are metal lines plated on a plane according to coil patterns, may be made of at least one selected from a group consisting of silver (Ag), palladium (Pd), aluminum (Al), nickel (Ni), titanium (Ti), gold (Au), copper (Cu), and platinum (Pt) having excellent electrical conductivity.

The conductor patterns 121 may include primary and secondary conductor patterns 121*a* and 121*b* disposed to be spaced from each other by a predetermined internal and electromagnetically coupled to each other. For example, as shown in FIG. 2, the respective patterns of the primary and secondary conductor patterns 121*a* and 121*b* may be alternately disposed on the same plane so as to be spaced from each other by a predetermined pitch. Alternatively, unlike this, the primary and secondary conductor patterns 121*a* and 121*b* may be disposed so as to be vertically spaced from each other by a predetermined interval.

When currents having the same direction are applied to the primary and secondary conductor patterns 121*a* and 121*b* electromagnetically coupled to each other as described above, magnetic fluxes are reinforced with each other, such that a common mode impedance is increased to suppress common mode noise, and when currents having different direction are applied to the primary and secondary conductor patterns 121*a* and 121*b*, magnetic fluxes are offset against each other, such that a differential mode impedance is decreased. Therefore, the coil component according to an exemplary embodiment of the present invention may serve as a common mode filter passing desired transmission signals therethrough.

An internal space except for the conductor patterns 121 in the coil layer 120 may be made of an insulating material 122.

The coil layer 120 having the above-mentioned structure may be formed by alternately stacking the conductor patterns 121 and insulating layers by a thin film process. This will be described in detail by a method of manufacturing a coil component to be described below.

The ESD protecting layer 130, which is a layer serving to bypassing static electricity introduced into the conductor patterns 121 to discharge the static electricity to the outside, may include external electrodes 131 electrically connected to the conductor patterns 121 through via electrodes 123, ground electrodes spaced apart from the external electrodes 131 by a predetermined interval, and ESD protecting materials 133 disposed between the external electrodes 131 and the ground electrodes 132.

Here, the ESD protecting material 133, which is a composite having electrically conductive metal powders dispersed in a matrix made of a polymer resin, has an infinite resistance value in a normal state in which static electricity is not present therein. Therefore, a current applied to the ESD protecting material 133 through the external electrode 131 flows to the conductor pattern 121. On the other hand, when an overcurrent due to the static electricity is applied to the ESD protecting material 133, an electron tunneling phenomenon that a conductive path is formed between metal powders in the ESD protecting material 133 occurs. Therefore, the overcurrent is discharged to the ground electrode 132 through the ESD protecting material 133.

According to the related art, an inorganic material such as $Al_2O_3$, $TiO_2$, $SiO_2$, ZnO, $In_2O_3$, NiO, CoO, CuO, MgO, $ZrO_2$, AlN, or the like, has been used as the matrix of the ESD protecting material. However, these materials are non-magnetic and have a lower magnetic permeability and a high magnetic resistance. Therefore, unlike the present invention, when the ESD protecting layer made of these materials is positioned between the magnetic substrate and the coil layer, a main magnetic flux loop generated in the coil layer and formed using the magnetic substrate as a closed magnetic circuit is blocked by the ESD protecting layer between the coil layer and the magnetic substrate, such that coil characteristics are deteriorated.

However, in an exemplary embodiment of the present invention, the ESD protecting layer 130 is disposed on the coil layer 120 rather than between the magnetic substrate 110 and the coil layer 120, thereby making it possible to minimize loss of the main magnetic flux loop. In addition, in order to manufacture the coil component having the above-mentioned structure, a low temperature curable material that may be sintered under a low temperature atmosphere may be used as a material of the ESD protecting material 133.

For example, the ESD protecting material may be completed by weighting powders of at least one selected from a group consisting of Ni, Cu, Au, Ti, Cr, Ag, Pd, and Pt and a low temperature curable polymer resin such as an epoxy resin, a phenol resin, an urethane resin, a silicon resin, a polyimide resin, or the like, at a predetermined ratio and then wet-mixing them with each other using a ball mill, or the like. A process of manufacturing a coil component using the low temperature curable ESD protecting material 133 will be described later in detail.

The ESD protecting layer 130 may further include first bump electrodes 134 disposed on the external electrodes 131 and second bump electrodes 135 disposed on the ground electrodes 132. The first and second bump electrodes 134 and 135, which are thick film electrodes directly bonded on a mounting surface of the substrate, may be thicker than the conductor patterns 121. In addition, it is preferable that copper (Cu) is used as a material of the first and second bump electrodes 134 and 135.

In addition, the ESD protecting layer may further include a magnetic resin material 136 filled in the vicinity of the external electrodes 131 and the ground electrodes 132 as well as the first bump electrodes 134 and the second bump electrodes 135. That is, an internal space except for the external electrodes 131, the ground electrodes 132, the ESD protecting materials 133, the first bump electrodes 134, and the second bump electrodes 135 in the ESD protecting layer 130 of FIG. 1 may be made of the magnetic resin material 136.

In this structure, the ESD protecting materials 133 as well as the external electrodes 131 and the ground electrodes 132 are buried in the magnetic resin material 136, the external electrodes 131 are electrically conducted to the outside through the first bump electrodes 134, and the ground electrodes 132 are electrically connected to the outside through the second bump electrodes 135.

In addition, the magnetic resin material 136 is filled up to a height of the first and second bump electrodes 134 and 135 to configure a mounting surface of the coil component, and serves as a closed magnetic circuit of the coil component simultaneously with protecting the coil layer 120 together with the magnetic substrate 110.

The magnetic resin material 136 may be made of a low temperature curable magnetic paste that may be sintered under a low temperature atmosphere. For example, the magnetic resin material 136 may be completed by weighting magnetic powders of at least one selected from a group consisting of Ni based ferrite, Ni—Zn based ferrite, and Ni—Zn—Cu based ferrite and a low temperature curable polymer resin such as an epoxy resin, a phenol resin, an urethane resin, a silicon resin, a polyimide resin, or the like, at a predetermined ratio and then wet-mixing them with each other using a ball mill, or the like.

Meanwhile, the coil component according to an exemplary embodiment of the present invention may further include a magnetic resin layer 140 disposed between the coil layer 120 and the ESD protecting layer 130. The magnetic resin layer 140 may be made of the same low temperature curable magnetic paste as that of the magnetic resin material 136 and serve as a closed magnetic circuit of the coil component together with the magnetic substrate 110 and the magnetic resin material 136.

Hereinafter, a method of manufacturing a coil component according to an exemplary embodiment of the present invention will be described.

Figure 3:
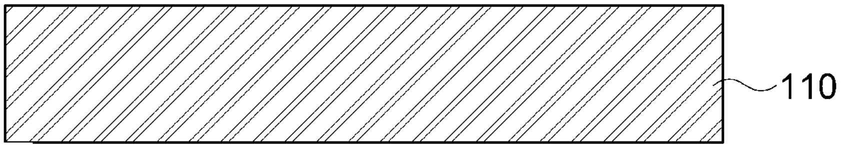
FIGS. 3 to 7 are views sequentially showing processes of a method of manufacturing a coil component according to an exemplary embodiment of the present invention.

FIGS. 3 to 7 are views sequentially showing processes of a method of manufacturing a coil component according to an exemplary embodiment of the present invention. First, as shown in FIG. 3, the magnetic substrate 110 is prepared.

The magnetic substrate 110 may be manufactured by sintering a ferrite material capable of obtaining a predetermined inductance, for example, an Ni based ferrite material containing $Fe_2O_3$ and NiO as main components, an Ni—Zn based ferrite material containing $Fe_2O_3$, NiO, and ZnO as main components, an Ni—Zn—Cu based ferrite material containing $Fe_2O_3$, NiO, ZnO, and CuO as main components, or the like, under a high temperature atmosphere and then cutting a sintered body in a desired shape (for example, a hexahedral shape).

Figure 4:
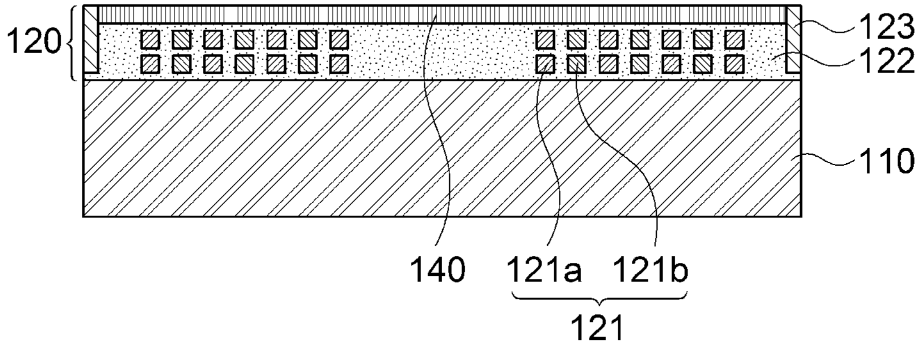

When the magnetic substrate 110 is prepared as described above, the coil layer 120 in which the conductor patterns 121 are installed is formed on the magnetic substrate 110, as shown in FIG. 4.

The coil layer 120 may be formed by a thin film process. For example, assume that the conductive patterns 121 have a two-layer structure including upper and lower layers. First, a first insulating layer is formed on the magnetic substrate 110 by a spin coating method, or the like, and lower layer conductor patterns 121 are formed on the first insulating layer by a general semi-additive process (SAP), a modified semi-additive process (MSAP), a subtractive process, or the like, that has been known in the related art. Then, a second insulating layer is formed on a surface of the first insulating layer so as to cover the lower conductor patterns 121, contact holes for connecting upper and lower conductor patterns 121 to each other are formed in the second insulating layer, and the upper conductor patterns 121 are formed on the second insulating layer. Here, inner portions of the contact holes are filled with metal to electrically connect the upper conductor patterns 121 and the lower conductor patterns 121 to each other. Finally, a third insulating layer is formed on a surface of the second insulating layer so as to cover the upper conductor patterns 121, thereby making it possible to complete the coil layer 120. Here, at the time of forming the conductor patterns 121 on the respective layers, the via electrodes 123 for connecting the conductor patterns 121 and the external electrodes 131 to each other may be formed together with the conductor patterns 121.

As described above, when the coil layer 120 is completed by the thin film process, the ESD protecting layer 130 is formed on the coil layer 120, thereby making it possible to finally complete the coil component according to an exemplary embodiment of the present invention.

Figure 5:
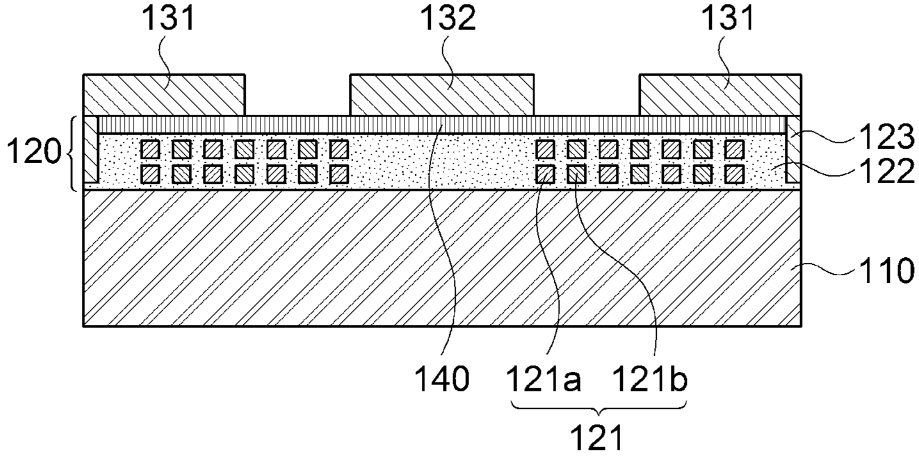

A process of forming the ESD protecting layer 130 may start with forming the external electrodes 131 and the ground electrodes 132. To this end, a seed layer is deposited over an entire surface of the coil layer 120 by a sputtering method, or the like, a dry film is attached to the seed layer, and opening parts are formed in positions in which the external electrodes 131 and the ground electrodes 132 are to be formed by an exposing and developing process to expose the seed layer. Then, electroplating is performed using the seed layer as a lead wire to plate and grow inner portions of the opening parts. Next, when the dry film is removed and the seed layer exposed to the outside is removed, the external electrodes 131 and the ground electrodes 132 as shown in FIG. 5 may be formed.

Figure 6:
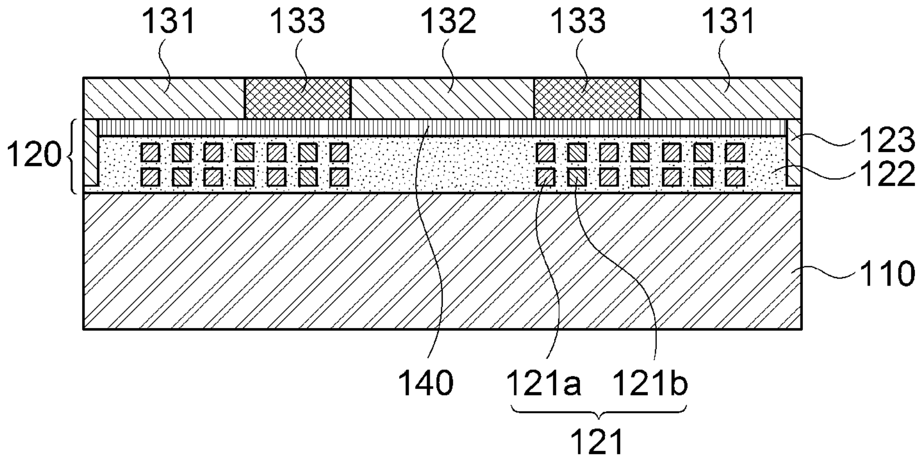

Then, as shown in FIG. 6, the ESD protecting materials 133 are formed between the external electrodes 131 and the ground electrode 132. The ESD protecting materials 133 may be formed by attaching a dry film onto the coil layer 120, forming opening parts in positions at which the ESD protecting materials 133 are to be formed, filling a mixture paste of metal powders and a low temperature curable resin in the opening parts, and then removing the dry film. When the ESD protecting materials 133 are formed, a sintering process for curing the ESD protecting materials 133 is performed. Here, the sintering process may be performed under a low temperature atmosphere of about 150 to 200° C.

As described above, the low temperature curable ESD protecting materials 133 are used and sintered at a low temperature, thereby making it possible to prevent damage the insulating material 122 configuring the coil layer 120. As a result, the coil component according to an exemplary embodiment of the present invention may have a structure in which the ESD protecting layer 130 is disposed on the coil layer 120.

That is, in the case of using a high temperature curable ESD protecting material made of an inorganic material such as $Al_2O_3$, $TiO_2$, $SiO_2$, ZnO, $In_2O_3$, NiO, CoO, CuO, MgO, $ZrO_2$, AlN, or the like, as in the related art, when the ESD protecting layer is formed on the coil layer and is then subjected to sintering at a high temperature of, for example, 1000° C. or more as in an exemplary embodiment of the present invention, the insulating material configuring the coil layer is melted or vanished. Therefore, according to the related art, the ESD protecting layer made of the high temperature curable ESD protecting material is stacked on the magnetic substrate, the ESD protecting layer and the magnetic substrate are simultaneously fired, and the coil layer is formed on the ESD protecting layer by a thin film process. As a result, a main magnetic flux loop generated in the coil layer and formed using the magnetic substrate as a closed magnetic circuit is blocked by the ESD protecting layer, more specifically, the non-magnetic ESD protecting materials, positioned between the coil layer and the magnetic substrate, such that coil characteristics are deteriorated.

Figure 7:
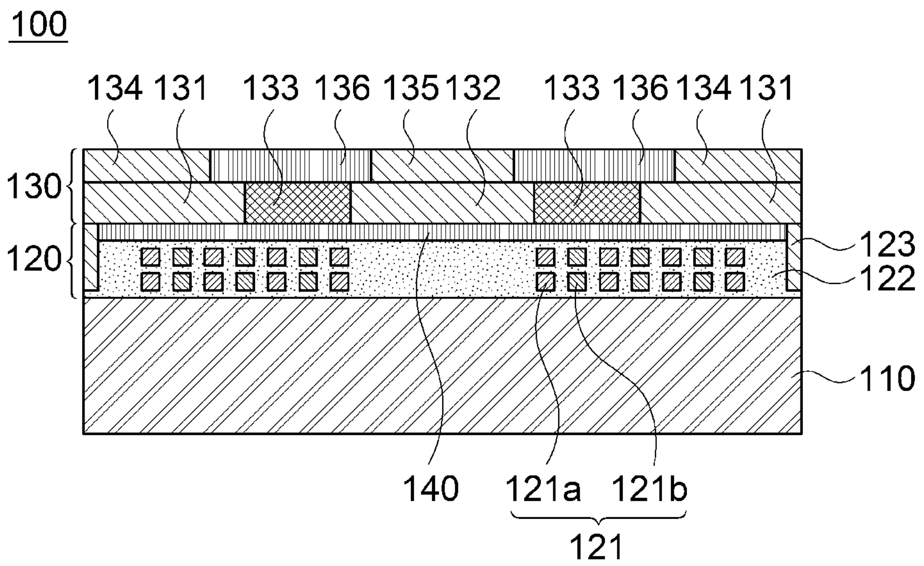

When the ESD protecting materials 133 are cured by sintering at a low temperature, finally, as shown in FIG. 7, the first bump electrodes 134 are plated on the external electrodes 131, the second bump electrodes 135 are plated on the ground electrodes 132, and a magnetic paste is filled in the vicinity of the external electrodes 131 and the ground electrodes 132 as well as the first and second bump electrodes 134 and 135 to form the magnetic resin material 136.

The first bump electrodes 134 and the second bump electrodes 135 may be formed in a scheme similar to a scheme of forming the external electrodes 131 and the ground electrodes 132. In addition, as the magnetic paste, a slurry prepared by weighting magnetic powders of at least one selected from a group consisting of Ni based ferrite, Ni—Zn based ferrite, and Ni—Zn—Cu based ferrite and a low temperature curable polymer resin such as an epoxy resin, a phenol resin, an urethane resin, a silicon resin, a polyimide resin, or the like, at a predetermined ratio and then wet-mixing them with each other using a ball mill, or the like, may be used. The slurry prepared as described above is filled up to a height of the first and second bump electrodes 134 and 135 and is then sintered under a low temperature atmosphere.

Meanwhile, before the ESD protecting layer 130 is formed, the magnetic resin layer 140 may be formed by applying a magnetic paste onto the coil layer 120 and then performing a sintering process. As the magnetic paste for forming the magnetic resin layer 140, a low temperature curable magnetic paste such as the magnetic resin material 136 may be used. Therefore, when the low temperature curable magnetic paste is sintered, it may be sintered under a low temperature atmosphere so as not to damage the insulating material 122.

When the coil component according to an exemplary embodiment of the present invention is used, characteristics of the coil component may be significantly improved without a phenomenon that a main magnetic flux loop is blocked due to a non-magnetic ESD protecting material as in the related art.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed exemplary embodiments. It is to be understood that other exemplary embodiments are also included within the spirit and scope of the appended claims.

What is claimed is:

1. A coil component comprising:

a magnetic substrate;

a coil layer disposed on the magnetic substrate and having conductor patterns installed therein; and an electrostatic discharge (ESD) protecting layer disposed on the coil layer and discharging static electricity introduced into the conductor patterns, wherein the ESD protecting material is made of a low temperature curable resin in which electrically conductive metal powders are dispersed.

2. The coil component according to claim 1, wherein the ESD protecting layer includes external electrodes connected to the conductor patterns through via electrodes, ground electrodes spaced apart from the external electrodes, and ESD protecting materials formed between the external electrodes and the ground electrodes.

3. The coil component according to claim 2, wherein the ESD protecting layer further includes first bump electrodes disposed on the external electrodes, second bump electrodes disposed on the ground electrodes, and a magnetic resin material filled in the vicinity of the external electrodes and the ground electrodes as well as the first and second bump electrodes.

4. The coil component according to claim 3, wherein the magnetic resin material comprises a mixture of a magnetic powder and a low temperature curable resin.

5. The coil component according to claim 1, wherein an internal space except for the conductor patterns in the coil layer comprises an insulating material.

6. The coil component according to claim 1, further comprising a magnetic resin layer disposed between the coil layer and the ESD protecting layer.

7. The coil component according to claim 6, wherein the magnetic resin layer comprises a mixture of a magnetic powder and a low temperature curable resin.

8. The coil component according to claim 1, wherein the conductor patterns include primary conductor patterns and secondary conductor patterns electromagnetically coupled to each other.

9. The coil component according to claim 1, wherein the electrically conductive metal powders include at least one selected from the group consisting of Ni, Cu, Au, Ti, Cr, Ag, Pd, and Pt.

* * * * *